(12) United States Patent
Zhao et al.

(10) Patent No.: US 9,305,607 B2
(45) Date of Patent: Apr. 5, 2016

(54) LOGICAL MEMORY ARCHITECTURE, IN PARTICULAR FOR MRAM, PCRAM, OR RRAM

(75) Inventors: Weisheng Zhao, Massy (FR); Sumanta Chaudhuri, Watford (GB); Claude Chappert, Garches (FR); Jacques-Olivier Klein, Bures sur Yvette (FR)

(73) Assignees: UNIVERSITE PARIS SUD 11, Orsay (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 62 days.

(21) Appl. No.: 14/007,017

(22) PCT Filed: Mar. 23, 2012

(86) PCT No.: PCT/FR2012/050617
§ 371 (c)(1),
(2), (4) Date: Sep. 24, 2013

(87) PCT Pub. No.: WO2012/168591
PCT Pub. Date: Dec. 13, 2012

(65) Prior Publication Data
US 2014/0016390 A1    Jan. 16, 2014

(30) Foreign Application Priority Data
Mar. 24, 2011 (FR) .................................. 11 52472

(51) Int. Cl.
G11C 11/00 (2006.01)
G11C 5/06 (2006.01)
G11C 11/16 (2006.01)
G11C 13/00 (2006.01)

(52) U.S. Cl.
CPC .......... *G11C 5/06* (2013.01); *G11C 11/16* (2013.01); *G11C 13/0002* (2013.01); *G11C 5/063* (2013.01); *G11C 2213/77* (2013.01)

(58) Field of Classification Search
CPC ....... G11C 5/063; G11C 7/18; G11C 11/4097
USPC ............................. 365/63, 158, 207, 210, 171
See application file for complete search history.

(56) References Cited

U.S. PATENT DOCUMENTS

| 5,640,343 A | 6/1997 | Gallagher et al. |
| 6,055,178 A * | 4/2000 | Naji ............................... 365/158 |
| 6,552,927 B2 * | 4/2003 | Naji ............................... 365/158 |

(Continued)

*Primary Examiner* — Connie Yoha
(74) *Attorney, Agent, or Firm* — Greer, Burns & Crain, Ltd.

(57) ABSTRACT

An architecture and method are provided for reading and writing, in parallel or in series, an electronic memory component based on a two-dimensional matrix of two-terminal binary memory unit cells built into a crossbar architecture. The component includes a logical column-selector located outside the matrix and activating at least one column, one or more cells of which are subjected to read or write processing. Also provided is a component and method with the reading of the status of the cells by differential detection on from two cells of two different rows, either between a storage column and a constant reference column, or between two rows or two storage columns. A component is also provided in which specific selection structure is exclusively dedicated to read operations, and/or in which complementary cells in two complementary columns connected together are encoded in a single atomic operation by means of a single write current.

27 Claims, 8 Drawing Sheets

(56) References Cited

U.S. PATENT DOCUMENTS

| | | |
|---|---|---|
| 6,724,653 B1 | 4/2004 | Iwata |
| 6,795,336 B2 | 9/2004 | Kim et al. |
| 7,272,035 B1 * | 9/2007 | Chen et al. .................. 365/158 |
| 7,715,228 B2 | 5/2010 | Deak |
| 7,764,536 B2 | 7/2010 | Luo et al. |
| 2007/0097736 A1 | 5/2007 | Inokuchi et al. |
| 2007/0258282 A1 | 11/2007 | Ueda et al. |
| 2008/0205119 A1 | 8/2008 | Nagai et al. |
| 2009/0027952 A1 | 1/2009 | Kang et al. |
| 2010/0046282 A1 | 2/2010 | Deak |
| 2011/0044090 A1 | 2/2011 | Terada et al. |

* cited by examiner

LOGICAL MEMORY ARCHITECTURE, IN PARTICULAR FOR MRAM, PCRAM, OR RRAM

BACKGROUND

The present invention relates to an architecture and a method for reading in parallel and writing in parallel or in series an electronic memory component based on a two-dimensional matrix of binary memory unit cells with two terminals, integrated within a "crossbar" type architecture. According to the invention, this component comprises logic column selection means outside the matrix, which activate at least one column one or more cells of which have to be subjected to read or write processing. It also relates to such a component and method with reading of the state of the cells by differential detection starting from two cells of two different rows, either between a storage column and a constant reference column, or between two rows or two storage columns that correspond to each other in a two-by-two manner.

The invention also relates to such a component in which certain selection means are dedicated exclusively to read operations, and/or in which complementary cells in two complementary columns connected to each other are encoded in a single atomic operation by the same write current.

In the field of rewritable random access computer memories or RAM (Random Access Memory), volatile or non-volatile, a storage unit is generally realized using a grid formed by a series of intersecting rows and columns, where each intersection can have two different states in order to constitute one memory bit. One series, for example the rows, is used to define the different bits inside a memory word; the other series then defining the different words, in this case using the columns.

Generally, there is every benefit to be gained from improvements to known memory technologies, for example in terms of density or reliability or simplicity or flexibility of manufacturing; among other things to keep up with developments in the performances of other electronic or computer components and thus allow the realization of technically homogeneous systems.

The technologies that are currently most widespread, for example DRAM or EEPROM, are provided at each intersection with a transistor, the terminals of which are connected to a row and a column as well as to a third connection. This configuration is sometimes called "1MTJ+1T" meaning "1 magnetic tunnel junction+1 transistor".

A novel non-volatile RAM memory technology called MRAM is based on the use of cells using the tunnel magnetoresistance (TMR) effect, each connected between a row and a column. Each of these cells comprises a specific stack of two ferromagnetic layers, connected in series with a diode or a transistor according to the writing technology. Depending on the relative direction of the magnetic fields present in these two magnetic layers, parallel or antiparallel, the stack has a different ohmic resistance, thus determining two different states for the cell.

This MRAM technology is non-volatile and has for example the advantage of a good density capability and resistance to environmental conditions. However it has technological implementation difficulties, for example for read reliability due to resistance variation between the two states being fairly small, with a Ron/Roff ratio of the order of 1.5 and in any case less than 3. By comparison, other storage-memory technologies using resistance variation are currently being developed, for example RRAM (Resistive RAM) or MWCM (Molecular Wire Crossbar Memory) technologies, which can locally have a Ron/Roff ratio of the order of 1000 to 10,000.

Memories provided with FIMS (Field Induced. Magnetic Setting) writing technology are now already commercially available in certain advanced fields. Each cell comprises a ferromagnetic stack and a diode or a transistor, and the matrix then has a "1 MTJ +1 D" or "1 MTJ +1T" configuration. Writing is carried out by passing two strong currents through the row and the column concerned, so as to generate two crossed magnetic fields at the two ends of the cell. The role of the diode is to prevent the current from passing through the cell itself. The document U.S. Pat. No 5,640,343 thus presents an operating architecture for an MRAM memory in FIMS technology.

Other MRAM memory writing technologies are currently being developed which have the advantage of much lower consumption: STT (Spin Transfer Torque) or TA STT (Thermally Assisted Spin Transfer Torque) or VIMS (Voltage Induced Magnetic Switching). Unlike the FIMS technologies, these writing technologies require a current to be passed through the cell, up to a current threshold (in STT or up to a voltage threshold (in VIMS), to change the magnetization in one of the layers, for example by spin transfer of the electrons by means of a tunnel effect within the stack, which is called MTJ (Magnetic Tunnel Junction).

The document U.S. Pat. No. 7,764,536, for example, presents an architecture for an STT type operation (in FIGS. 1 to 3), for which it seeks to improve the internal performances of the sense amplifier (Sensing Amplifier) and to reduce its consumption.

In this architecture, the matrix has a "1 MTJ+1T" configuration. Each cell (10 FIG. 1, 110 FIG. 3 in U.S. Pat. No. 7,764,536) comprises an MTJ junction (12 FIG. 1, 112 FIG. 3) in series with a transistor (14 FIG. 1, 114 FIG. 3), and thus comprises three connections:

one end of each cell is connected to a bit line (Bit Line 18 FIG. 1, 103 or 111 FIG. 3 in U.S. Pat. No. 7,764,536),
   the other end of each cell is connected to a source line (Source Line 20 FIG. 1, 111 or 103 FIG. 3 in U.S. Pat. No. 7,764,536), and
   the grid of the transistor of each cell is connected to a word line (Word Line 16 FIG. 1, 105 FIG. 3 in U.S. Pat. No. 7,764,536).

In this type of architecture in general, the cells are realized at each intersection of three lines, generally two lines parallel to each other and perpendicular to the third. In this document U.S. Pat. No. 7,764,536, the architecture is presented (FIG. 2) with the bit lines perpendicular to the source lines and to the word lines.

In write mode, each cell is selected and written one after the other. For each cell (10') selected, the word line (16') which corresponds thereto is activated to turn on the transistors of the cells of this word. A bit selector (34) selects the bit line and the source line of this cell and connects them to a write driver (40), which applies to them a write voltage oriented in one direction or in the other according to the write state.

In read mode, each cell (10') is selected and read one after the other. For each cell (10') selected, the corresponding word line (16') is activated to turn on the transistors of all the cells of this word. The bit selector (34) selects the bit line and the source line of this cell and connects them to a sense amplifier (Sense Amplifier 38). This amplifier carries out a reading of the resistance of the selected cell (10') by comparison with the resistance of a reference cell (Reference Generator 26) received by a reference line (Reference Line 46).

This MRAM architecture with a write current passing through the cell could however be improved, in particular in terms of greater density, better reliability, and/or greater manufacturing simplicity or flexibility.

The document U.S. Pat. No. 6,795,336 (Kim et al.) for example uses a specific structure of the cells with one of the three connections linked to a plate (CP) common to several cells.

The document EP 1 321 944 uses cells integrated within a matrix, and each comprising several junctions managed by the same selection transistor.

The presence of these three connections per cell nevertheless also represents a constraint that limits the possibility of increasing the density. Furthermore, the logic management circuits of the cells represent a significant space requirement, typically equivalent to that of the matrix that they manage.

The document U.S. Pat. No. 7,715,228 proposes a different architecture that can be used in SU, which uses multipole analog switches situated at the end of each of the rows and columns of the cell grid or matrix.

In order to select a cell to be written, these switches connect the row selected to the nominal write voltage and the column selected to the ground; whereas the rows not selected are connected to a first intermediate voltage and the columns not selected are connected to a second intermediate voltage. The cells not selected thus only receive a current lower than the write current, and do not change state during the writing of the cell selected.

In order to select a cell to be read, these switches connect its row to the nominal read voltage and its column to the ground; whereas the other rows are left open and the other columns for their part are also connected to the read voltage.

This technique has drawbacks because the cells not selected are still subjected to a certain voltage, which makes the range of voltage values more difficult to adjust, and can also be a source of interference.

Furthermore, each row and column end has a high space requirement, which adversely affects the density of the overall circuit, since it has to be provided with a multipole analog switch as well as four connections including three different voltage supplies.

The fitting of such a large number of analog components within a logic circuit can moreover be a source of additional difficulties of integration and compatibility.

SUMMARY

A purpose of the invention is to remedy the drawbacks of the prior art and improve performances, in particular with regard to the following:
- increasing the density and the integration capabilities of a memory unit, and/or of an integrated circuit which contains it, in particular but not exclusively in MRAM technology;
- improving reliability, in particular read reliability;
- improving the speed of read or write operation;
- simplifying the manufacturing and/or integration constraints;
- while so far as possible maintaining the advantages of the storage technology, such as for example environmental resistance or shelf life.

For this, the invention proposes an electronic memory component comprising at least one two-dimensional matrix including in an integrated manner a plurality of unit memory cells, in particular binary, which are each realized at the intersection of a first conductor defining a column and a second conductor defining a row within said matrix, and are each connected to said first and second conductors.

According to the invention, this component comprises column selection means outside the matrix, which are arranged according to a binary logic in order to selectively activate at least one column conductor to which is connected at least one cell that has to be subjected to read or write processing, or in any case detection ("sensing") or state change ("switching") processing.

The invention applies to memories written by a current passing through the cell, for example in MRAM storage (with SU, TA+STT or VIMS writing) but also in other technologies with a write current passing through such as memories with PCRAM (Phase Change RAM) storage, which generally operate with a current threshold, or RRAM (Resistor RAM) memories, including MWCMs which generally operate with a voltage threshold.

Preferably, the cells of the matrix do not comprise electrically conductive external connections apart from those which link them to the first conductor and the second conductor.

This architecture can thus be described as "crossbar", and can be applied to storage technologies which until now have required three connections per cell.

It can be seen that this architecture makes it possible to greatly reduce the space requirement of the matrix since each cell only needs to be connected to two conductors, typically two series perpendicular to each other in two parallel planes superimposed within the same level of integration.

The density of this matrix can thus be increased, for example by bringing the conductors of each series, as well as the two superimposed planes, closer together up to the limits permitted by the manufacturing resolution and the operation of the cells.

This connection architecture is more particularly beneficial for use with MRAM memories written by a current passing through, for example SU or TA+STT or VIMS, in which it makes it possible to completely remove any active PN junction semiconductor element, in particular to remove the transistor from each cell as used in the prior art. This removal thus makes it possible to overcome the obstacle of the maximum resolution specific to the PN junctions, and then to increase the density up to the limits allowed by the nature of the magnetoresistive junction, such as an MTJ magnetic tunnel junction.

With this in mind, the invention proposes several particular possibilities for the architecture of the selection means.

Thus, the invention proposes for example a first selection method in which the column selection means comprise at least two transistors, and preferably only two, realized or connected in integrated manner at at least one end of the column conductors, and which are each arranged in order to selectively connect at least one column conductor to a first potential or to a second potential different from the first potential.

Under certain operating conditions, the connection of this column conductor to one of these potentials cooperates with read or write management means of at least one defined row in order to pass a read current, or a write current to one state current in one direction, through a cell belonging to this column and to this row.

Under other operating conditions, the connection of this column conductor to the other of these potentials cooperates with write management means of at least one defined row in order to pass a write current to the other state in the other direction through a cell belonging to this column and to this row.

The overall density of the circuit can also be increased because the number of transistors to be managed for the selection of the cells is much smaller. Typically, the management logic block can then be distributed in integrated manner at the periphery of the cell matrix whereas, in the prior art, it has generally formed a second block the same size as this matrix itself.

Typically, in this first selection method, the column selection means comprise for each column at least one first transistor and one second transistor different from the first transistor, which are realized or connected in integrated manner at at least one end of the conductor of said column. These two transistors are each arranged in order to connect said column conductor selectively to a first potential or to a second potential, and are arranged as follows:

the first transistor is realized or connected in integrated manner at a first end of said at least one activated column, selectively cooperating:
    on the one hand with read management means of at least one defined row, in order to pass a read current through a cell belonging to said column and to said row, and
    on the other hand with write management means of said at least one defined row, which write management means are arranged in order to pass a write current to one state in one direction through said cell; and
the second transistor is realized or connected in integrated manner at a second end of said at least one activated column cooperating with write management means of said at least one defined row, which write management means are arranged in order to pass a write current to the other state in the other direction through said cell.

Thus, the first transistor forms a write and also read transistor for one state; and the second transistor forms a write transistor for the other state.

Similarly, the invention proposes for example a second selection method in which the column selection means comprise for each column at least one first transistor and one second transistor, and preferably only these two transistors, realized or connected in integrated manner at at least one end of the conductor of said column, and which are each arranged in order to connect at least said column conductor selectively to a first potential or to a second potential, which can be identical to each other.

In this second selection method:
this first transistor is arranged in order to selectively connect this column conductor to this first potential and cooperate with read management means of at least one defined row in order to pass a read current through a cell belonging to this column and to this row; and
this second transistor is arranged in order to selectively connect this column conductor to this second potential, in cooperation with write management means of at least one defined row. Moreover, these write management means are arranged in order to selectively pass:
    on the one hand, in one direction, a write current to one state through a cell to be written belonging to this column and to this row, and
    on the other hand, in the other direction, a write current to the other state through this same cell.

As described below, the first potential V1 can for example be fixed independently of the second, for example at 0 V (grounding). The read management means can then generate the read current by applying a higher potential, for example the supply potential Vdd.

The second potential V2 can be for example a fixed potential used for writing, for example the supply potential Vdd.

The write management means can then be provided in order to generate a write current by applying:
    a potential less than V2, for example 0 V, for writing in one direction, and
    a potential greater than V2, for example 2×Vdd, for writing in the other direction.

In this second selection method, one of the selection transistors is used only for reading. It is therefore possible for its dimensions to be made much smaller than that used for reading, since the read currents are much lower, for example of the order of 1 µA to 10 µA in the case of reading instead of 200 µA in the case of writing. A better compactness of the matrix block or of its connections is thus obtained.

These smaller dimensions also make it possible to obtain better read reliability, because the read currents used are closer to the maximum capacity of the transistor than in the case of a transistor with write dimensions, for example approximately 70% instead of 7%.

Similarly, the invention for example proposes a third selection method in which the column selection means also comprise transistors dedicated to reading.

In this third selection method, for each pair of columns complementary to each other, each of these two complementary columns comprises at least one first transistor, and preferably only one, realized or connected in integrated manner at one end of the conductor of this column. This first transistor, one for each column, is arranged in order to selectively connect this column conductor to a defined potential in cooperation with read management means of at least one defined row in order to pass a read current through a cell belonging to this column and to this row.

Moreover, for each pair of columns complementary to each other, this third selection method comprises at least one second transistor, and preferably only one, realized or connected in integrated manner at one end of the conductors of these two complementary columns. This second transistor, one for two complementary columns, is arranged in order to selectively connect these column conductors to each other in cooperation with write management means of at least two defined rows in order to pass a write current, selectively in one direction or in the other direction, successively:
    through at least one first cell belonging to one of these columns and to one of these rows, then
    through said second transistor, then
    through at least one cell complementary to the first cell and belonging to the other of these columns and to the other of these rows.

If the two complementary cells are produced with the same orientation between the column and row conductors, the two cells are then passed through in opposite directions with respect to their structure, and are thus encoded in opposite states to each other.

The write management means can for example comprise two drivers applying two different potentials, in one direction or in the other depending on the direction of the write current to be obtained.

They can also comprise a connection of one of the two rows with a defined potential (for example Vdd), in permanent manner or controlled by a transistor, and a write driver connected to the other row and supplying a potential higher or lower than the fixed potential as a function of the direction of the write current to be obtained.

This third selection method brings the same advantages of compactness and reliability of use of the read transistors as the second selection method.

It also allows the number of write transistors to be divided by two, which makes it possible to improve the overall compactness of this part of the circuit.

This twinning of the columns with each other also makes it possible to obtain atomicity for the operation of writing a storage bit, since the two complementary cells are written by the same current. The risk of their state being changed separately from each other is therefore greatly limited by this, even in the event of hardware malfunction within the matrix or within its direct control components. This results in better reliability of the write operations.

In these different selection architectures, the two transistors of the column selection means can be situated for example at the two opposite ends of the column conductor that they activate. This allows distribution of the space requirement around the matrix and heat dissipation, thus optimizing compactness and performance.

According to another aspect of the invention, which can also be applied to technologies other than MRAM, this component comprises means for reading the state of said cells by differential reading of at least one electrical value originating from at least
- one first cell connected to a first column and to a first row; and
- one second cell connected to a second row different from the first row.

According to a feature, the second cell is moreover connected to a second column different from the first column, preferably situated a number of columns less than 10% of the total number of columns of said matrix distant from said first column.

This characteristic can bring advantages, for example of simplicity or even of density, depending on the manufacturing method implemented.

According to another feature, the first row and the second row are very close to each other with respect to the dimensions of the matrix, for example situated a number of rows less than 20% or even 10% of the total number of rows of this matrix distant from each other.

Preferably, the first row and the second row are contiguous and each comprise a plurality of cells connecting them, one and then the other alternately, to the columns that they successively intersect.

According to yet another feature, the component comprises on the one hand at least one first column referred to as an even reference column (CERef) the cells of which are connected to a first series of rows referred to as even rows (EBL0 to EBL3) arranged to read said even reference cells by differential reading with the cells of at least one first series of columns referred to as even read columns (C0, C2, C4, C6), and on the other hand at least one second column referred to as an odd reference column (CORef) the cells of which are connected to a second series of rows referred to as odd rows (OBL0 to OBL3) arranged to read said odd reference cells by differential reading with the cells of at least one second series of read columns referred to as odd read columns (C1, C3, C5).

Moreover, according to another aspect of the invention which can be implemented independently of the other characteristics, on the one hand the cells of one of the reference columns have an electrical resistance less than the resistance of the cells of the read columns and, on the other hand, the cells of the other reference column have an electrical resistance greater than the resistance of the cells of the read columns.

Preferably, the first column and the second column are very close to each other with respect to the dimensions of the matrix, for example situated a number of columns less than 20% or even 10% of the total number of columns of this matrix distant from each other.

Preferably, the first column and the second column are contiguous and each comprise a plurality of cells connecting them, one and then the other alternately, to the rows that they successively intersect;

According to a variant, the second cell is also connected to the first column.

This variant can bring possibly different advantages, for example of simplicity or even of density, in different manufacturing process situations or functions.

The characteristics of the read architecture of the invention make it possible to greatly improve the read reliability of each cell within a matrix. In fact, the differential reading between two MTJ memory elements of the same kind is much more regular and stable than a reading by comparison with a reference resistance, for example because it is far less sensitive to environmental variations in the circuit overall and locally within the circuit, as well as to the manufacturing drifts between two circuits and within the same circuit or the same matrix.

This architecture also makes it possible to carry out a differential reading between memory elements that are much closer to each other, which limit the inaccuracies due to the manufacturing drifts within a matrix itself. Moreover, the two elements of the differential reading are situated neither on the same row nor on the same column, which limits for example their interference with each other.

This architecture is very advantageous for MRAM memories because it makes it possible to greatly alleviate the problems of read reliability posed by the small difference between the two states of the memory element, the Ron/Roff ratio of which is particularly small. It can however also be applied in other types of memories, in particular of resistive type such as for example RRAM (and MWCM) memories, and make it possible to improve the reliability, the density and/or alleviate the technological constraints in terms of resolution or manufacturing.

According to other features of the invention that can be combined with each other and with the others disclosed here, which are advantageous for example in terms of density and reliability:
- the read means comprise a plurality of detection amplifiers which are realized or connected in integrated manner at a first end of rows of the matrix, for example always on the same side or alternating, and which are each connected to two rows of the matrix and arranged in order to carry out a differential reading from said two rows.
- the write means comprise a plurality of write circuits which are realized or connected in integrated manner at a second end of the rows of the matrix, for example always on the same side or alternating, and which are each connected to a row of the matrix and arranged and controlled by input data in order to write at least one cell of said row.
- this first end and this second end of the rows are the two opposite ends of the conductors of said rows.

By the use of multiple write or read control circuits dedicated to a small number of lines, or even to a single line, read reliability is also improved by limiting for example the losses or interferences that can result from the connections to remote circuits or intermediate selection circuits.

Contrary to what might be thought at first, this multiplication of the number of write and read control circuits outside the matrix does not necessarily represent a greater overall space requirement, since they can then be simpler and can be realized in integrated manner at the ends of the lines that they manage, further reducing their distance from the cells to be managed.

According to need, different combinations can be produced. In order to obtain in particular good performances in terms of read and write speed, it is possible for example to realize an integrated circuit comprising a plurality of read means and write means integrated at one or both ends of the rows, making it possible to read in parallel and write in parallel.

It is also possible to produce an integrated circuit comprising a plurality of read means integrated at one end or both ends of the rows.

Three-dimensional Integration

Moreover, in the invention, it is seen that the grid mainly has simple connections situated only on its periphery, in the same level as the two superimposed series of conductors. It is possible to superimpose several cell matrices one on top of the other, each possibly with its selection logic on the periphery. The invention thus allows a significant possibility for an increase in density by 3D vertical integration, for example in the form of a unit of several cell matrices superimposed within a two-dimensional integrated circuit or directly within an integrated circuit itself realized in three dimensions.

According to a feature of the invention that can be combined with the others disclosed here, such a component can thus comprise at least one first cell matrix realized in integrated manner in a first level which is integrated in superimposed manner with at least:
 a second level in which a second cell matrix is realized in integrated manner; and/or
 a second level in which a control circuit is realized in integrated manner, arranged in order to include the selection means, or the read management means, or the write management means, or means for managing the read or write data, or a combination of these means.

Similarly, the invention also proposes an electronic memory component manufacturing system which comprises means arranged in order to realize a component as disclosed here.

Similarly also, the invention also proposes a method for read and/or write processing of at least one unit cell of memory belonging to a two-dimensional memory matrix as disclosed here, and comprising the following steps:
 selective activation in binary manner of at least one column containing at least one unit cell to be processed, by column selection logic means outside said matrix;
 carrying out write and/or read processing on said at least one cell to be processed, by write management means and/or read management means arranged in order to process at least one first row to which said at least one cell to be processed belongs.

Because of the architecture disclosed here, it can be seen that it becomes possible to carry out parallel processing of several cells belonging to the same column or to two columns complementary to each other.

Thus, the processing step can comprise a parallel operation of reading a plurality of cells belonging to the activated column, which is carried out by a plurality of sense amplifiers connected to the plurality of rows to which the processed cells belong, typically one amplifier for each pair of rows.

The processing step can also comprise a parallel operation of writing a plurality of cells belonging to the activated column, which is carried out by a plurality of write controllers connected to the plurality of rows to which the processed cells belong, typically one write controller for each row.

An improvement in performances is thus obtained in terms of read and/or write speed.

According to a variant, the processing of the memory matrix can also comprise:
 on the one hand at least one reading in parallel of the bits of a memory word formed by a plurality of cells read within at least one column; and
 on the other hand at least one writing in series of the bits of said memory word within said at least one column, by a plurality of write operations each relating to a number of cells strictly less than the number of said plurality of cells read.

Thus the number of simultaneous writing operations is limited, which minimizes the maximum current that must be able to be supported by the selection transistors at the ends of columns, while retaining the advantages of a parallel reading which takes place with individual currents much lower than in the case of writing. The constraints on these selection transistors are thus alleviated, which makes it possible for example to minimize their space requirement and/or their heating.

Various embodiments of the invention are provided, incorporating the different optional characteristics disclosed here according to all of their possible combinations.

BRIEF DESCRIPTION OF THE DRAWINGS

Other features and advantages of the invention will become apparent from the detailed description of an embodiment which is in no way limitative, and the attached drawings in which:

FIG. 1 is a diagrammatic partial perspective view illustrating a memory matrix according to the invention, in an MRAM technology written by a current passing through;

DETAILED DESCRIPTION

Figure 1:
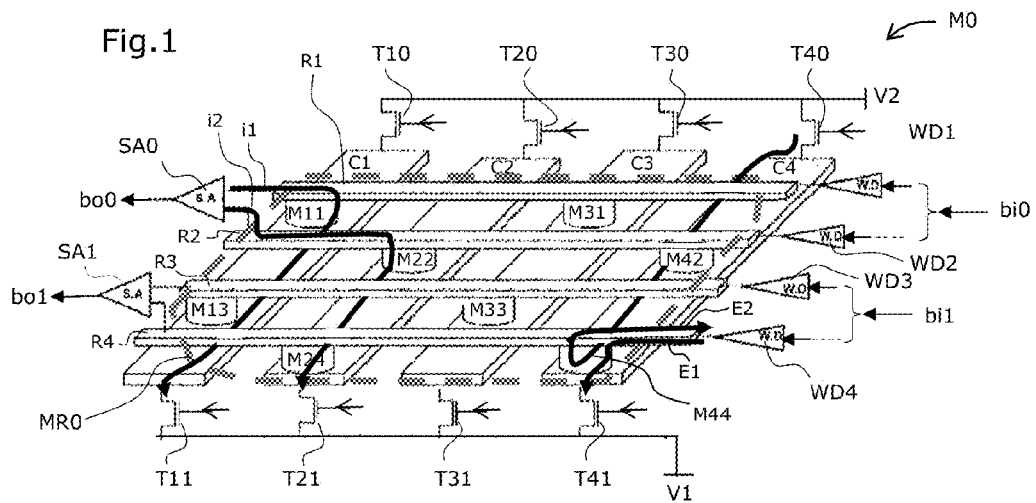

FIG. 1 is a diagrammatic partial perspective view illustrating a component M0 according to the invention, including a memory matrix MR0, for example in an MRAM technology written by a current passing through.

This electronic memory component M0 comprises a two-dimensional matrix MR0 including in an integrated manner a plurality of binary memory unit cells M11 to M44. These cells are each realized in integrated manner, for example by methods known to a person skilled in the art, at the intersection of a first conductor defining a column C1 to C4 and a second conductor defining a row R1 to R4 within this matrix MR0, and are each connected to these first and second conductors.

|     | column |     |     |     |
| --- | ------ | --- | --- | --- |
| row | C1     | C2  | C3  | C4  |
| R1  | C11    |     | C31 |     |
| R2  |        | C22 |     | C42 |
| R3  | C13    |     | C33 |     |
| R4  |        | C24 |     | C44 |

According to the invention, this component comprises column selection means T10 to T41 outside the matrix MR0 itself, which are arranged according to binary logic in order to selectively activate at least one column conductor to which is connected at least one cell that must be subjected to read or write processing, or in any case detection ("sensing") or state change ("switching") processing.

Writing

Figures 2A, 2B:
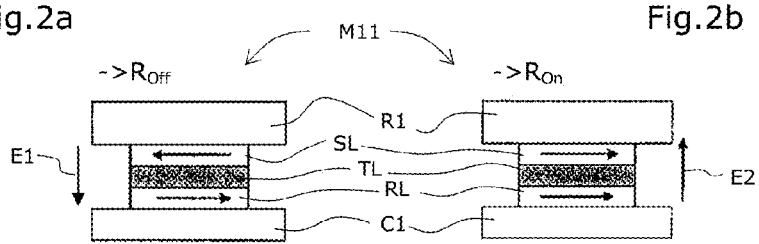
FIG. 2a and FIG. 2b are two diagrammatic front views representing the operation of a unit cell, in the case of an MRAM type technology.

As illustrated in FIG. 2a and FIG. 2b, in an embodiment example of the invention using an MRAM technology with current passing through (STT, TA+STT or VIMS), a unit storage cell M11 of the matrix MR0 is an MTJ of a type with change induced by current or voltage. It is realized between the column conductor C1 and the row conductor R1, and comprises in particular a ferromagnetic reference layer RL of constant magnetization represented by its internal arrow, then an oxide layer TL, then a ferromagnetic storage layer SL the magnetization (represented by its internal arrow) of which can be changed.

By passing a current corresponding to a value in one direction E1 (above a current or voltage threshold), the magnetization of the storage layer SL is forced to adopt a configuration referred to as $R_{Off}$, here $R_{Anti\text{-}parallel}$. This forcing thus encodes the cell M11 by changing it to the state $R_{Off}$. The application of a similar electrical value in the other direction E2 encodes the cell by changing it to the state $R_{On}$, here $R_{Parallel}$.

Thus, for an operation of changing to a first state $R_{Off}$ of at least one cell M44 referred to as a write cell, belonging to an activated column C4 and to at least one defined row R4, this operation comprises the following steps:
connection to a first potential V1 and in particular the ground, of the conductor of the activated column C4, by a first transistor T41 realized or connected in integrated manner at a first end of this activated column, and
creation, in this write cell M44, of a write current E1 in a first direction, by a current source WD4 connected to this row R4;

Conversely, for an operation of changing to a second state $R_{On}$ of a cell M44 referred to as a write cell, belonging to an activated column C4 and to a defined row R4, this operation comprises the following steps:
connection to a second potential V2 different from the first potential, and in particular the supply potential, of the conductor of the activated column C4, by a second transistor T40 different from the first transistor T41, realized or connected in integrated manner at a second end (the same end or the other end) of this activated column, and
creation, in this write cell M44, of a write current E2 in a second direction opposite the first direction, by a current source WD4 connected to this row R4.

Differential Reading

The component M0 comprises sense amplifiers SA0, SA1 for reading the state of these cells by differential reading of at least the electric currents i1 and i2 originating, for example and in the case of SA0:
from an example first cell M11 connected to a first column C1 and to a first row R1; and
from a second cell M22 connected to a second row R2 different from the first row and to a second column C2.

Thus, a read operation comprises the following steps:
activation of each of the columns to be activated C1, C2 by connection of its column conductor to a first potential V1, by a transistor T11, T21 realized or connected in integrated manner at a first end of said column;
creation, in one defined direction, of a read current in at least one cell referred to as a read cell M11 belonging both to one of said activated columns and to at least one first row R1, by at least one current source SA0 connected to said first row;
creation, in one defined direction, of a read current in at least one other cell referred to as a complementary cell M22 corresponding to said read cell M11, and which belongs both to one C2 of the activated columns and to at least one second row R2 different from said first row, by at least one current source SA0 connected to said second row;
reading of each of said read cells, by differential measurement of the currents i1, i2 passing on the one hand into said read cell M11 and on the other hand into said complementary cell M22, by at least one comparator circuit SA0 connected both to said first row and to said second row. Preferably, this comparator also forms the current generators of the two rows.

The following embodiments are examples of possibilities offered by the invention, and a description is given only of their details and differences with respect to the above disclosure.

First Embodiment

FIG. 3, FIG. 4, FIG. 6 and FIG. 7 illustrate the architecture and the operation according to the invention of a component M1 with reference columns and alternating cells, with reading and writing in parallel within the same word. The columns are here presented as forming "words" of memory, each containing several bits. However this is a naming convention, and the data can be distributed differently vis-à-vis the data received from and transmitted to the external components.

It is to be noted that this embodiment is here described with the first selection method for the writing, but could also be controlled according to the second selection method, in a manner similar to the example of FIG. 14 below.

Figure 3:
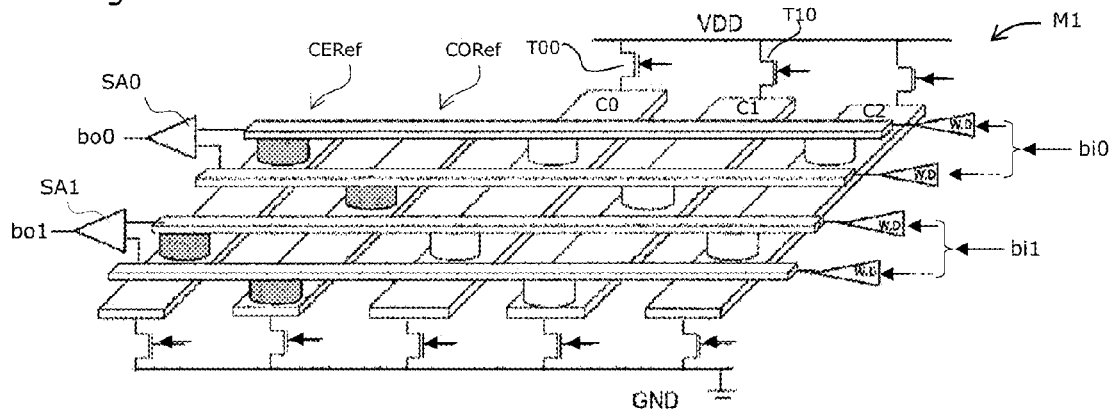
FIG. 3 is a diagrammatic partial perspective view illustrating a memory matrix according to the invention in a first embodiment, with reference columns and alternating cells, with writing and reading in parallel.

FIG. 3 shows the overall architecture in this embodiment example. This architecture comprises reference MTJs, shown shaded or in circles with thick outlines, which are intended only for reading and do not need to be changed. They can be of a type or dimension different from those of the other storage MTJs. They are distributed in alternating manner over two contiguous reference columns, one even column CERef and one odd column CORef.

The cells of the reference even column CERef serve as a reference for the reading of the cells of the even storage columns C0, C2, C4, C6; and the cells of the odd reference column CORef serve as a reference for the cells of the odd storage columns C1, C3, C5.

Within the same cell matrix, it is possible to provide several groups of reference columns, for example a pair of reference columns for a number of storage columns of the order of 20, or even 100 or 1000.

According to an option, the reference columns can be realized with reference cells which have a resistance different from the normal or average resistance of the memory cells. In particular, the reference column CERef, which is used for reading the cells of the even columns (C0, C2, C4, C6) can have reference cells with an electrical resistance greater than the resistance of the memory cells. In this case, the reference column CORef, which is used for reading the cells of the odd columns (C1, C3, C5) can have reference cells with an electrical resistance less than the resistance of the memory cells.

The values of deviations which are measured during the reading are then amplified, which increases the reliability of the reading.

In this architecture, each storage column C0 to C6 forms one word of several bits, one bit for each cell of the storage column, i.e. 4 bits per word in the present example.

For each storage column, a selection transistor T01 to T61 is used to activate each column for reading or writing to one of the states, here to the state '1'. At the other end of these columns, a selection transistor T00 to T60 is used to activate each column for writing to the other state, here to the state '0'. Preferably, the two transistors of each column are situated at its two opposite ends.

For each reference column, a single selection transistor TEW, TOW is provided to activate the column for reading.

Figure 4:
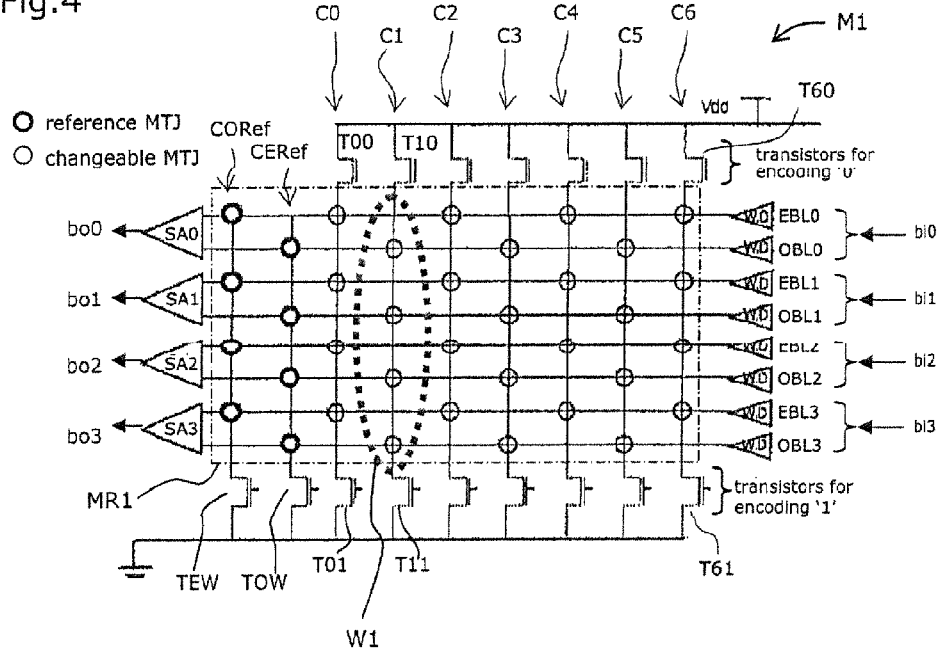
FIG. 4 is a plan diagram of the circuit of a memory matrix of FIG. 3, with reading in parallel and writing in parallel.

In the example of FIG. 4, a write driver WD is provided for each row, i.e. here 4 drivers for the 4 rows ER0 to ER3 of the even words and 4 drivers for the 4 rows OR0 to OR3 of the odd words.

Figure 6:
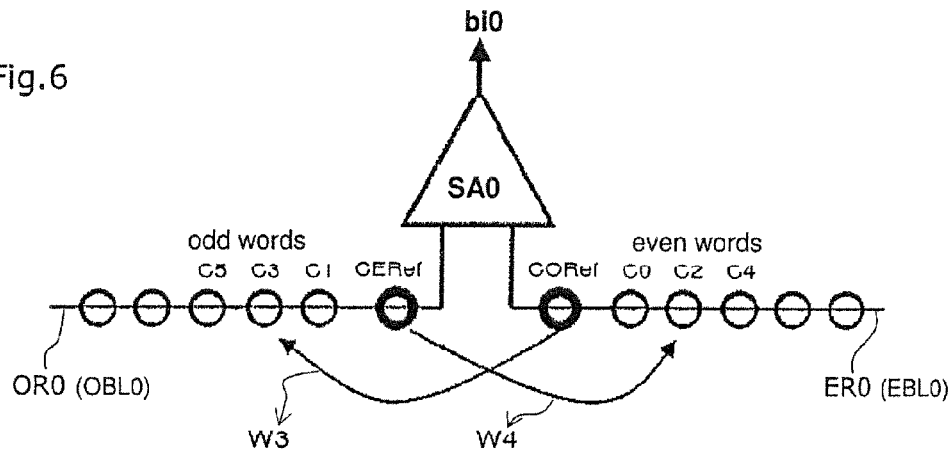
FIG. 6 and FIG. 7 are diagrams showing the operation of a memory matrix of FIG. 3.

As illustrated in FIG. 6, each sense amplifier SA0 to SA3 supplies one output bit Bo0 to bo3 by comparing the resistance of a changeable MTJ with that of the reference MTJ which corresponds thereto. For example the bit bo0 is obtained for the even words by comparing an MTJ of the even row ER0 with the reference MTJ of the even reference column CERef, which belongs to the odd row OR0. For the odd words, the bit bo0 is obtained by comparing an MTJ of the odd row OR0 with the reference MTJ of the odd reference column CORef, which belongs to the even row ER0.

The sense amplifier, for example of a model preloaded for greater reading speed, for example sends back a value '1' if the resistance of the right-hand branch ER0 is greater than that of the left-hand branch OR0.

Preferably, the reference MTJs are manufactured such that their reference resistance $R_{Ref}$, which is constant during the use of the component, has a value which is the average between the resistances $R_{Parallel}$ and $R_{Anti-parallel}$ of the storage resistances. Thus, between two different states of the storage MTJs, their resistance varies by an equal value on each side of the reference value $R_{Ref}$. The sense amplifier can thus operate with the same performances for the reading of the even and odd words, irrespective of the states to be detected.

Typically, the reference and storage MTJs are manufactured with the using the same methods as the storage MTJs, which makes it possible for example to maximize the detection performances, in particular in terms of reliability and stability.

Moreover, it is preferable not to carry out specific processing on the zones containing the reference MTJs, in order to avoid introducing disparities between the cells of the same matrix and thus reducing detection reliability.

Thus, the resistance of the reference MTJs is preferably adjusted only by the choice of their dimensions in the plane of the matrix, which are chosen different from those of the storage MTJs.

In a first configuration, the size of the reference MTJs is chosen smaller than for the storage MTJs, such that their parallel resistance is higher than the value $R_{Parallel}$ and lower than the value $R_{Anti-parallel}$ of the storage MTJs. The reference resistance $R_{Ref}$ used for the differential detection is the resistance in the parallel state, which is the state obtained on completion of manufacturing. In this case, it is possible to dimension the reference MTJs so that their resistance in the parallel state is equivalent to:

$$T_{Ref(Parallel)} = \frac{R_{parallel} + R_{anti-parallel}}{2}$$

For certain types of MTJ or under certain circumstances, the resistance $R_{Anti-parallel}$ depends on the bias voltage $V_{bias-sensing}$ of the two terminals of the MTJ during the reading. In this case, the reference resistance can be calculated as follows to take account of this variation:

$$R_{Ref(Parallel)} = \frac{R_{parallel} + R_{anti-parallel}(V_{bias-sensing})}{2}$$

This first dimensioning configuration makes it possible to have better read reliability because $R_{Ref}$ is constant, for example always in the parallel state. The dimension of the reference MTJs can then be adjusted to the lower technical feasibility limit, the minimum fabrication node. The storage MTJs are then of dimensions greater than this lower limit, which promotes their stability and therefore detection reliability rather than the achievable density.

In a second configuration, the reference MTJs can be of dimensions greater than those of the storage MTJs, which gives them lower resistance in the same state. The reference resistance $R_{Ref}$ used for the differential detection is then the resistance in the anti-parallel state. The reference MTJs are changed to this anti-parallel state from the parallel state originating from the manufacturing, by at least one step of initialization after manufacturing and preferably refresh operations during the lifetime and/or use of the component. In this configuration, the reference MTJs can be dimensioned so that their resistance in the anti-parallel state is equivalent to:

$$R_{Ref(Anti-Parallel)} = \frac{R_{parallel} + R_{anti-parallel}}{2}$$

Taking account of a dependency on $R_{Anti-parallel}$ with regard to the bias voltage $V_{bias-sensing}$ of the two terminals during reading, then the reference resistance can be calculated as follows:

$$R_{Ref(Anti-parallel)}(V_{bias-sensing}) = \frac{R_{parallel} + Ra(V_{bias-sensing})}{2}$$

This second dimensioning configuration makes it possible to obtain rather a better density, for example because the storage cells which are the most numerous can be of dimensions adjusted to be at the lower limit of technical feasibility, i.e. at the minimum manufacturing level, with the risk of a possible increase in the level of detection errors which would be due to the dependency of the $R_{Anti-parallel}$ with regard to the bias voltage $V_{bias-sensing}$.

Figure 7:
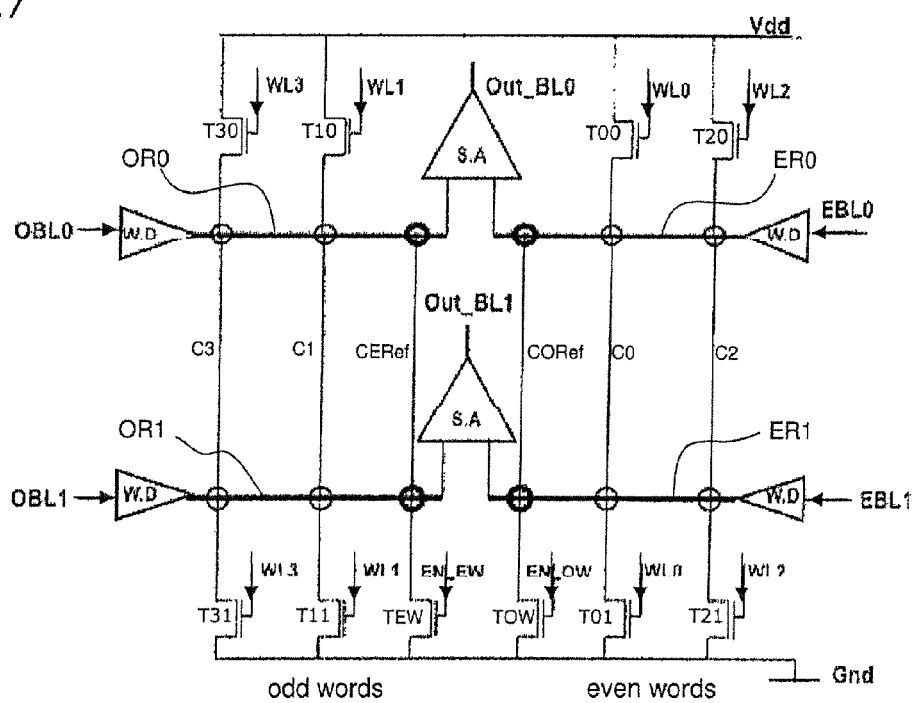

In FIG. 7 the fine vertical lines (representing the column conductors C0 to C3) on the one hand and the thick horizontal lines (representing the conductors of the rows OBL0 to EBL1) are connected to the two respective terminals of the different MTJ cells. The columns connect the MTJs to each other within a word, and can be isolated or activated by their associated selection MOS transistors. The transistors are controlled by the word lines (WL0 to WL3), their first terminals are connected to the columns of cells and their second terminals are connected to the ground.

In this embodiment, all the bits of the same word W1 are read in parallel. For the detection and reading, only the transistors on the ground side are activated, and the sense amplifiers manage or generate the read currents i1 and i2.

Figure 5:
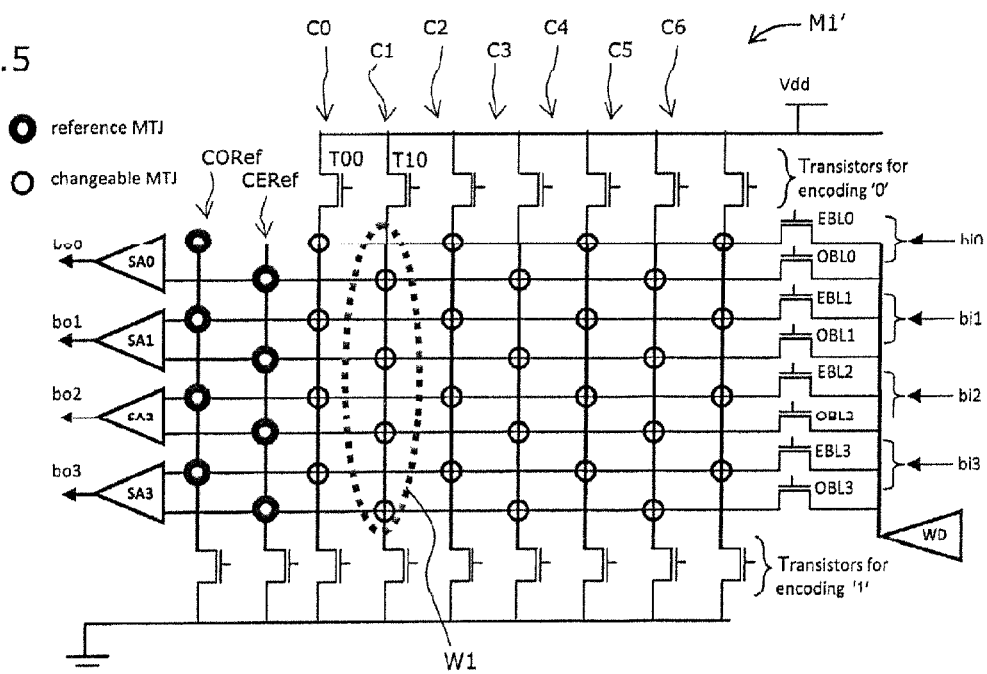
FIG. 5 is a plan diagram of the circuit of a memory matrix of the first embodiment, in a variant with reading in parallel and writing in series.

The read operation comprises the following steps, for example with reference to FIG. 4 or FIG. 5:
  activation of at least one first column (C0) referred to as a read column containing one or more cells referred to as read cells belonging to at least one row (EBL0, EBL1, EBL2, EBL3) connected to one input of at least one sense amplifier (SA0, SA1, SA2, SA3);
  activation of a column (CERef) referred to as a reference column common to several read columns (C0, C2, C4, C6), which reference column contains a reference cell for each of the read cells, each of said reference cells belonging to a row (OBL0, OBL1, OBL2, OBL3) connected to another input of the same sense amplifier as the read cell which corresponds thereto;
  reading of each of the read cells by differential measurement between said read cell and the reference cell which corresponds thereto.

It can be seen that the invention thus proposes a method for reading/writing which on the one hand uses at least one first reference column (CERef) to read the cells of at least one first series of read columns referred to as even read columns (C0, C2, C4, C6) containing cells connected to a first series of rows referred to as even rows (EBL0 to EBL3),
and on the other hand at least one second reference column (CORef) for reading the cells of at least one second series of read columns referred to as odd read columns (C1, C3, C5), which odd columns alternate with the even columns and contain cells connected to a second series of rows referred to as odd rows (OBL0 to OBL3).

The write drivers WD connected to their respective rows OBL0, OR0, OBL1, OR1 are controlled by the bit lines EBL0, OBL0, EBL1, OBL1 corresponding to the input bits bi0 to bi3.

In order to write a '0' in one or more cells of the same word, its transistor on the Vdd side is activated, and the write drivers concerned are controlled in order to generate the write current E2, in one direction. In order to write a '1' in one or more cells of the same word, its transistor on the ground side (GND) is activated, and the write drivers concerned are controlled in order to generate the write current E1, in the other direction.

It can be seen that it is thus possible to write in parallel all the bits of the same value within a word W1, for example to write '00' simultaneously with the drivers WD of OBL0 and OBL1 when the word line WL1 activates the transistor T10 of the column C1 in order to connect it to the potential Vdd. The same applies to the writing in parallel of '11' when WL1 activates the other transistor T11 in order to connect the column C1 to the ground.

This writing in parallel for each value to be encoded can also be carried out simultaneously for a group of two words of different parity, for example W0 and W1, because their respective rows (EBL0 to EBL3 and OBL0 to OBL3 respectively) are alternating and independent and each have an independent write driver.

FIG. 5 illustrates a variant of this first embodiment, in which reading is also carried out in parallel within a word; but where the writing is carried out in series, from one bit to the other. The write speed can be less rapid, but the sum of writing simultaneously passing through the write transistors and the row and column conductors is also lower. Thus heating is reduced, and it is moreover possible to dimension these elements reduced in size, requiring less space and/or more densely.

Second Embodiment

FIG. 8, FIG. 9, FIG. 10 and FIG. 11 illustrate the architecture and the operation of a component M2 in a second embodiment of the invention, which is described only with respect to its differences. In this embodiment with columns complementing each other two by two and alternating cells, reading and writing are carried out in parallel within the same word. The columns are here presented as forming "words" of memory, each containing several bits. However, this is a naming convention, and the distribution of the data can be done differently vis-à-vis the data received from and transmitted to the external components.

Figure 8:
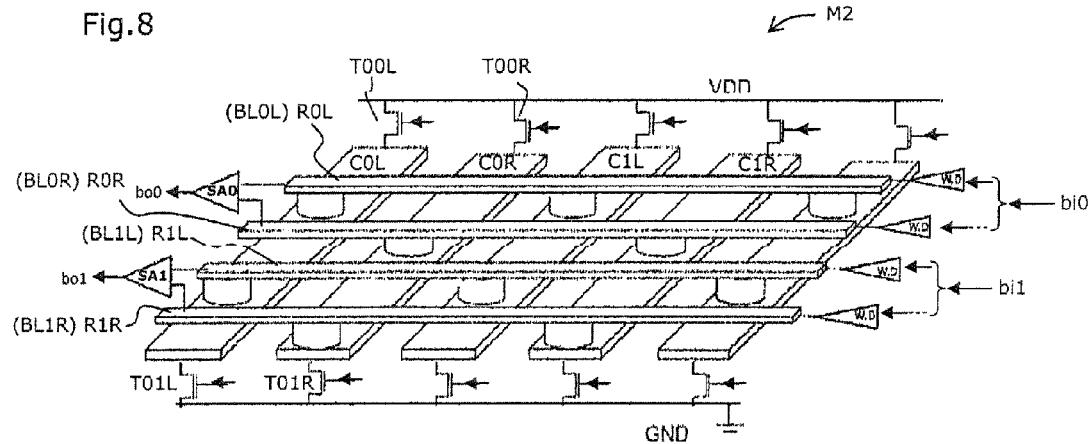
FIG. 8 is a diagrammatic partial perspective view illustrating a memory matrix according to the invention in a second embodiment, with complementary columns and alternating cells, with writing and reading in parallel.

FIG. 8 shows the overall architecture in this embodiment example. This architecture comprises MTJ columns distributed alternating in groups of two contiguous columns, here called left-hand columns COL, C1L, C2L, C3L and right-hand columns C0R, C1R, C2R, C3R. The cells of the left-hand columns are connected to rows referred to as left-hand rows R0L, R1L, R2L, R3L, and the cells of the right-hand columns are connected to rows referred to as right-hand rows R0R, R1R, R2R, R3R, which alternate with the left-hand rows.

Figure 9:
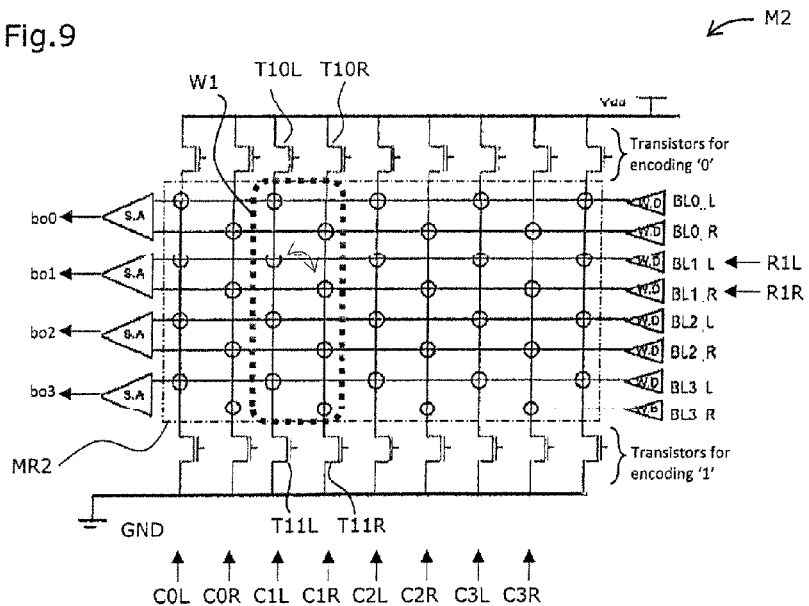
FIG. 9 is a plan diagram of the circuit of a memory matrix of FIG. 8.

As indicated by the double arrow in the matrix of FIG. 9, each cell of a left-hand column, for example at the intersection of C1L and R1L, is read by differential reading with its corresponding or complementary cell in the right-hand column C1R and the right-hand row R1R which corresponds thereto.

In this architecture, each pair of two complementary columns (left-hand and right-hand) form a word W1 of several bits, one bit for each pair of complementary cells, i.e. 4 bits per word in the present example.

For each column, a selection transistor, for example T11L and T11R for the word W1, is used to activate this column for reading, or writing to one of the states, here to the state '1'. At the other end of these columns, a selection transistor, for example T10L and T10R for the word W1, is used to activate each column for writing to the other state, here to the state '0'. Preferably, the two transistors of each column are situated at its two opposite ends.

Figure 10:
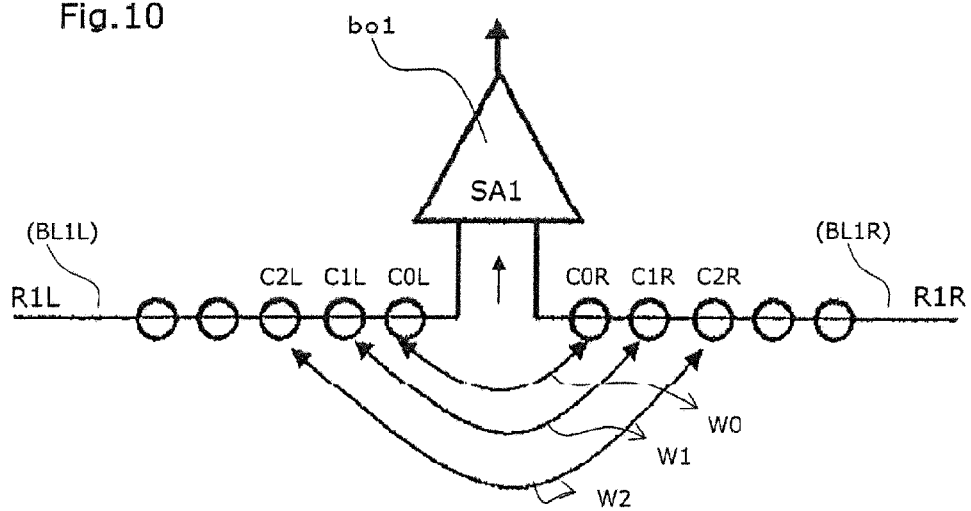
FIG. 10 and FIG. 11 are diagrams showing the operation of a memory matrix of FIG. 8.
Figure 11:
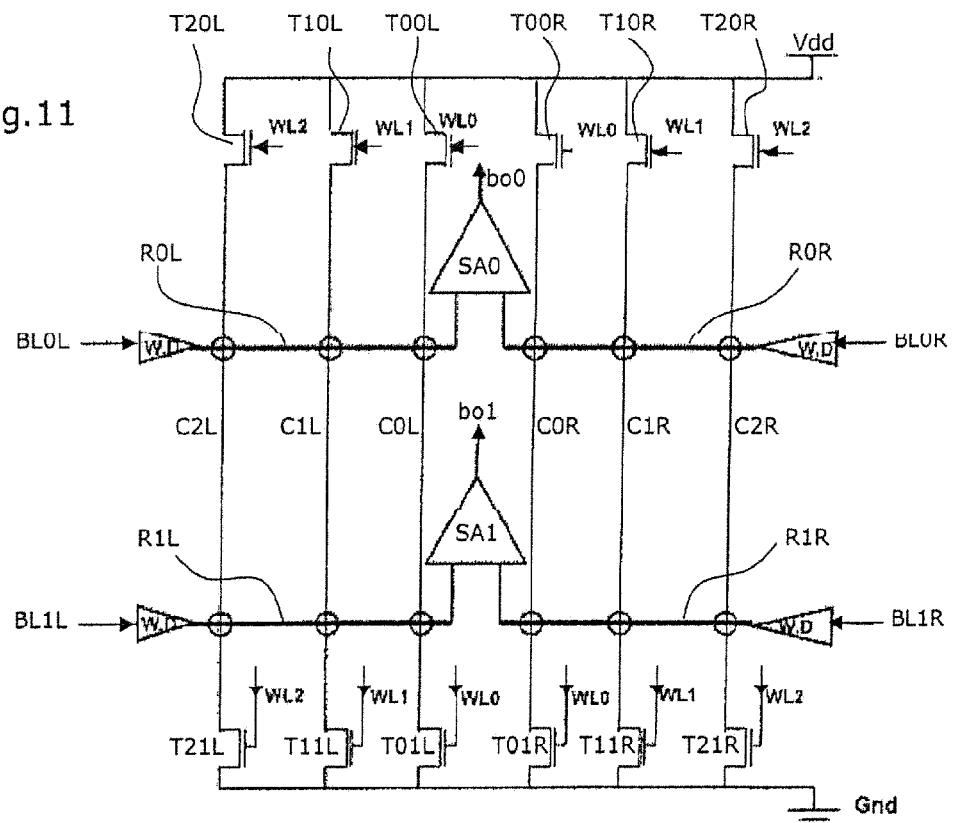
Figure 12:
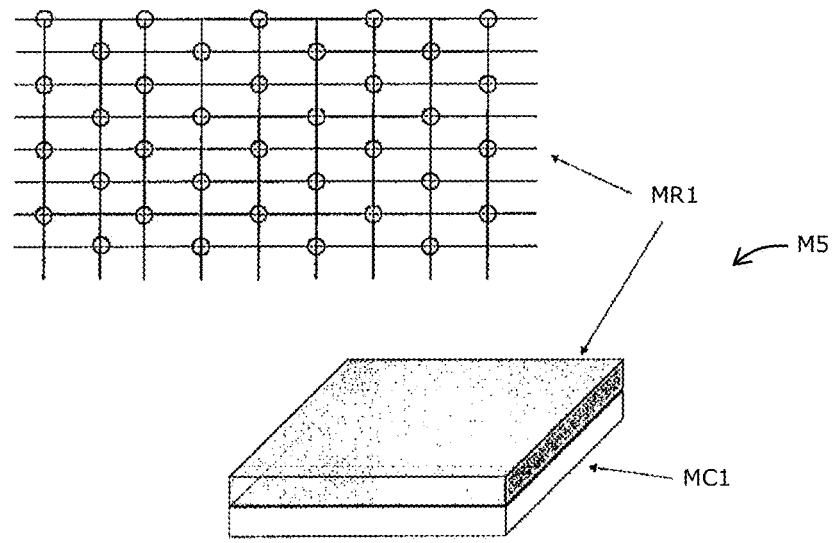
FIG. 12 is a diagram illustrating an example according to the invention of three-dimensional integration of a memory matrix with its control circuit.
Figure 13:
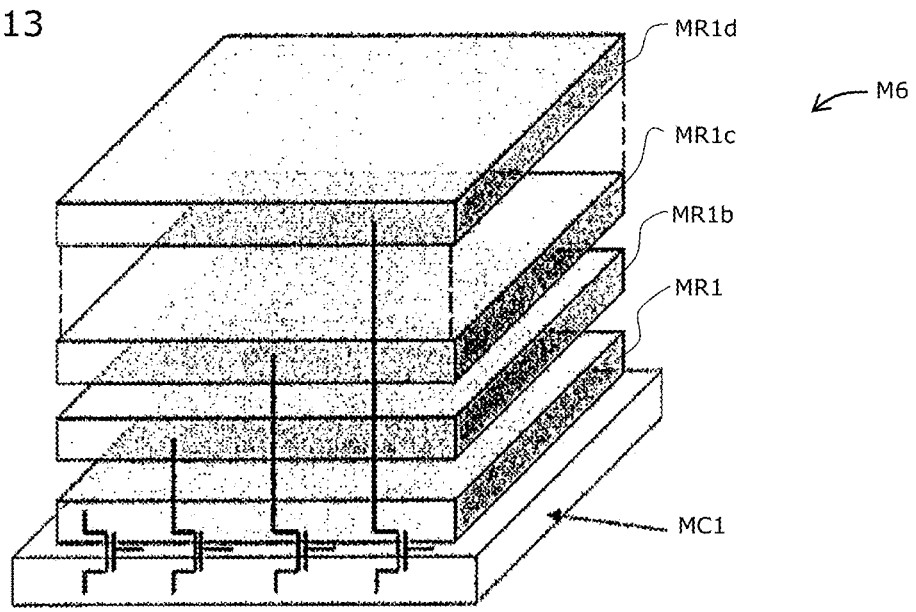
FIG. 13 is a diagram illustrating an example according to the invention of three-dimensional integration of a plurality of memory matrices with a common control circuit.

As illustrated in FIG. 10 and FIG. 11, each sense amplifier SA0 to SA3 supplies an output bit Bo0 to bo3 by comparing the resistance of one changeable MTJ with that of the other changeable MTJ which is complementary thereto. A storage bit is represented by two complementary cells which are encoded in two opposite states. This allows a greater resistance difference between the two states of the storage bit, and therefore a better read reliability.

The sense amplifier SA0, for example of a model preloaded for greater speed of reading, for example sends back a value '1' if the resistance of the right-hand branch ER0 is greater than that of the left-hand branch OR0.

In this embodiment, the reading of all the bits of the same word W1 is carried out in parallel. For the detection and reading, only the transistors on the ground side are activated, and the sense amplifiers manage or generate the read currents i1 and 12.

The read operation comprises the following steps:
activation of a first column referred to as a left-hand column C1L, containing one or more read cells referred to as left-hand read cells which belong to one or more rows referred to as left-hand rows R0L, R1L, R2L, R3L connected to one input of at least one sense amplifier SA0, SA1, SA2, SA3;
activation of a second column referred to as a right-hand column C1R, containing a cell referred to as a right-hand cell for each left-hand read cell, each right-hand cell belonging to a row referred to as a right-hand row R0R, R1R, R2R, R3R connected to the other input of the same sense amplifier than the left-hand cell which corresponds thereto;
reading of each of the left-hand read cells by differential measurement between said left-hand cell and the right-hand cell which corresponds thereto.

The write operations are realized in a manner similar to the first embodiment. They are realized by write drivers WD, illustrated here at a rate of one per row in order to allow writing in parallel, but could also be realized in series in a manner similar to FIG. 5.

Third Embodiment

Figure 14:
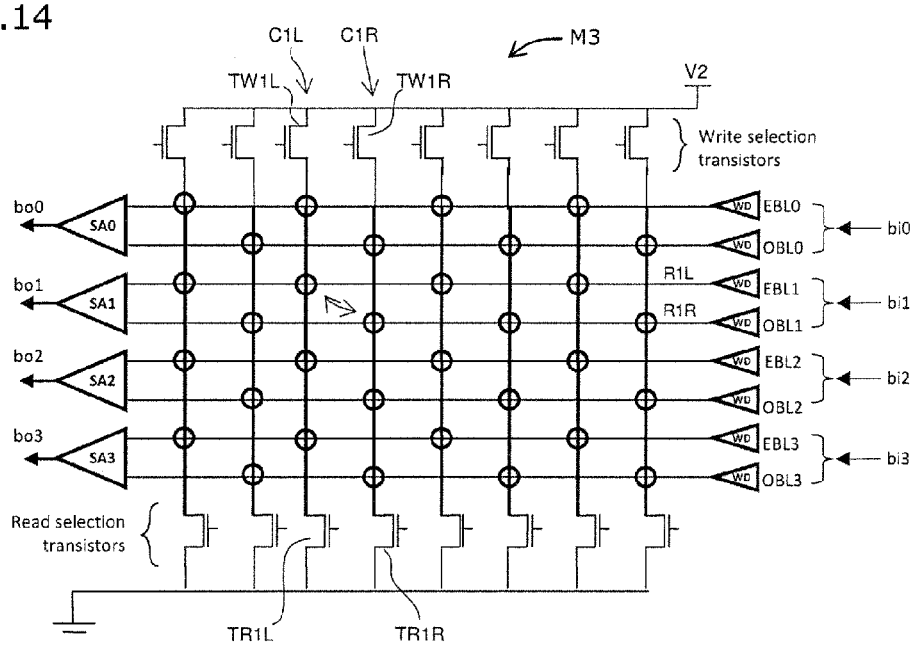
FIG. 14 is a plan diagram of the circuit of a memory matrix according to the invention in a third embodiment, with alternating cells and complementary columns, with selection transistors dedicated to reading and selection transistors dedicated to writing, with reading in parallel and writing in parallel.
Figure 15:
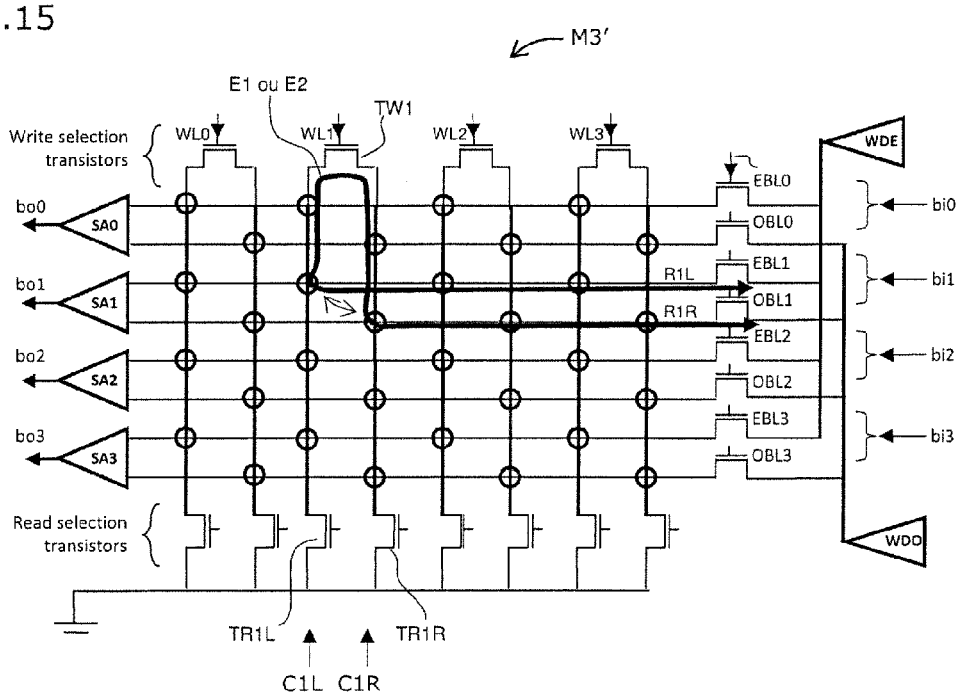
FIG. 15 is a plan diagram of the circuit of a memory matrix of the third embodiment, in a variant with complementary columns that can be connected to each other, with reading in parallel and writing in series.

FIG. 14 and FIG. 15 show a component M3, M3' in a third embodiment example approximating to the second embodiment with alternating cells and complementary columns disclosed above, and which is described only with respect to its differences. In this embodiment with alternating cells and complementary columns, certain selection transistors are dedicated to reading and other selection transistors are dedicated to writing. The reading is carried out in parallel in a word or a pair of words, in a manner similar to the second embodiment.

In this embodiment, the write step comprises an operation changing at least one cell referred to as a write cell, belonging to the at least one activated column C1L (FIG. 14) and to at least one defined row R1L, said change operation comprising the following steps:
connection to a defined potential V2, the supply potential Vdd, of the conductor of the at least one activated column C1L, by a single transistor TW1L realized or connected in integrated manner at a first end of said at least one activated column, and
creation, in said write cell, of a write current E1, E2 selectively in one direction or in the other, by at least one current source WD1L connected to said row R1L, so as to change said cell to one or the other of its states.

FIG. 14 illustrates a version with writing in parallel, in which the columns are all written by connection to the same defined potential, here Vdd.

The write drivers WD of the different rows R0L to R3R are controlled for the bit lines BL0L to BL3R in order to generate a write current by applying to them a potential of 0 V for writing in one direction, and a potential of 2×Vdd for writing in the other direction.

FIG. 15 illustrates a variant of the third embodiment using the third selection method with writing in series, in which the complementary columns can be connected to each other.

In this variant, the write step comprises an operation changing at least two cells referred to as write cells, belonging on the one hand to at least two different activated columns C1L, C1R and on the other hand to at least two different rows R1L, R1R, said change operation comprising the following steps:
connection of the conductors of the at least two activated columns C1L, C1R, to each other, for example by a transistor TW1 realized or connected in integrated manner at one end of said columns, and
creation, by at least one current source WDL, WDR connected to at least one of said rows R1L, R1R, of a write current E1, E2 successively passing through at least one cell belonging to one R1L of said columns and to one C1L of said rows, then through said transistor TW1, then through at least one cell belonging to the other C1R of said columns and to the other R1R of said rows, selectively in one direction or in the other, so as to simultaneously change the state of said cells.

The two write drivers WDR and WDL which manage the two groups of rows R0L to R3L and R0R to R3R are successively controlled by the bit lines BL0L to BL3R, in order to generate a write current by applying to them a potential of 0 V for writing in one direction, and a potential of 2×Vdd for writing in the other direction.

Fourth Embodiment

Figure 16:
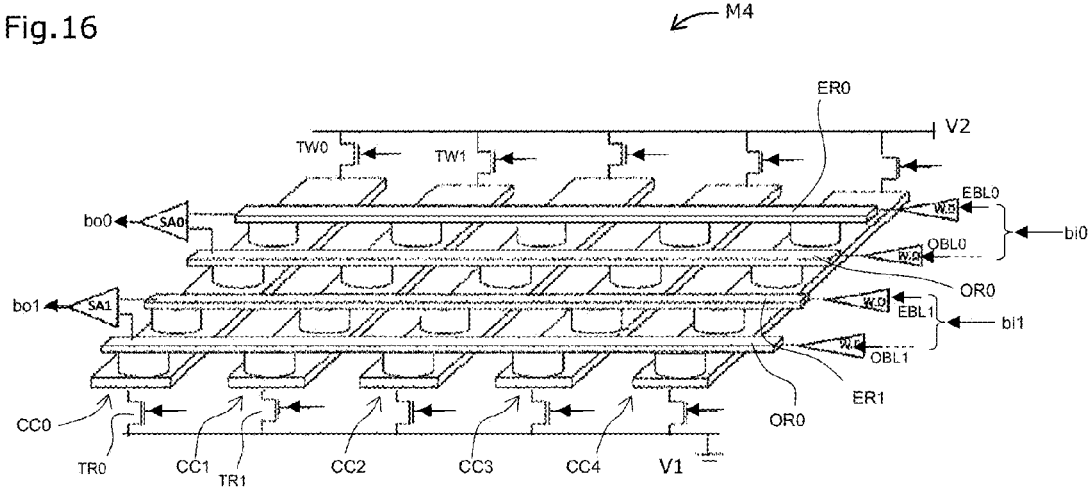
FIG. 16 is a perspective diagram of a memory matrix according to the invention in a fourth embodiment, with contiguous cells and complementary rows, with reading and writing in parallel.
Figure 17:
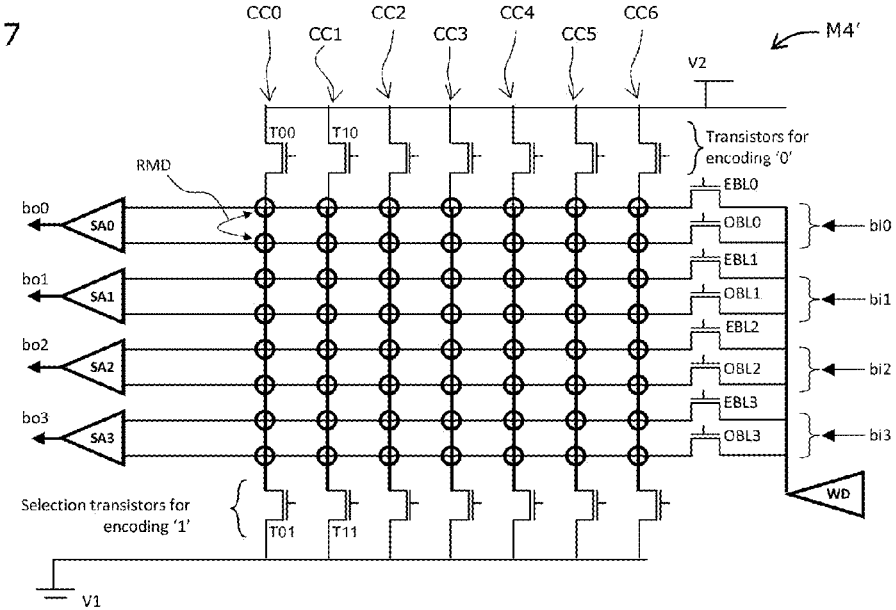
FIG. 17 is a plan diagram of the circuit of a memory matrix of the fourth embodiment, in a variant with reading in parallel and writing in series.

FIG. 16 and FIG. 17 show a component M4, M4' in a fourth embodiment example using the first or the second selection method disclosed above, with writing in parallel and reading in series respectively.

In this embodiment with contiguous cells and rows complementary to each other, the reading is carried out in parallel in a word or a pair of words, in a manner similar to the second embodiment, but between two complementary cells distributed for each storage bit over two different rows and a single column.

More particularly, the write operation comprises the following steps:
activation of at least one column CC0 containing
on the one hand one or more read cells referred to as even cells, belonging to one or more rows referred to as even rows ER0, ER1, ER2, ER3 connected to one input of a sense amplifier SA0, SA1, SA2, SA3, and
on the other hand one or more cells referred to as odd cells belonging to one or more rows referred to as odd rows OR0, OR1, OR2, OR3 each of which is connected to the other input of the same sense amplifier than the even row which corresponds thereto;

reading of each of the even read cells by differential measurement between said even read cell and another cell referred to as an odd cell which corresponds thereto, belonging both to the same activated column CC0 and to the odd row corresponding to said even row.

Of course, the invention is not limited to the examples that have just been described and numerous adjustments can be made to these examples without exceeding the scope of the invention.

The invention claimed is:

1. An electronic memory component, comprising:
at least one two-dimensional matrix including a plurality of unitary memory cells, each of said unitary memory cells including two terminals, said unitary memory cells are each realized at the intersection of a first conductor defining a column and a second conductor defining a row within said matrix, and are each connected to said first and second conductors; and
column selection means outside said matrix, said column selection means arranged according to a binary logic to selectively activate at least one column conductor connected to at least one defined cell that must be subjected to read or write processing, the column selection means including at least two transistors for each column, which are each arranged to connect at least said column conductor selectively to a first potential or to a second potential different from said first potential,
wherein the connection of said column conductor to said first potential cooperates with read management means or write management means of at least one defined row to pass a read current, or a write current to one state in one direction, through a cell belonging to said column and to said row, and
wherein the connection of said column conductor to said second potential cooperates with write management means of said at least one row in order to pass a write current to the other state through said cell in the other direction.

2. The component according to claim 1, wherein the at least two transistors of the column selection means are for each column realized or connected in integrated manner at at least one end of the conductor of said column.

3. The component according to claim 1, wherein the column selection means comprise for each column at least one first transistor and one second transistor, different from the first transistor, which are realized or connected in integrated manner at at least one end of the conductor of said column, and which are each arranged in order to connect said column conductor selectively to a first potential (GND) or to a second potential (Vdd);
said first transistor being realized or connected in integrated manner at a first end of said at least one activated column and cooperating selectively:
with read management means of at least one defined row, in order to pass a read current through a cell belonging to said column and to said row, and
with write management means of said at least one defined row, which write management means are arranged in order to pass a write current to one state through said cell in one direction; and
said second transistor being realized or connected at a second end of said at least one activated column and cooperating with write management means of said at least one defined row, which write management means are arranged in order to pass a write current to the other state through said cell in the other direction.

4. The component according to claim 1, wherein the column selection means comprise for each column at least one first transistor and one second transistor realized or connected in integrated manner at least one end of the conductor of said column, and which are each arranged in order to connect at least said column conductor selectively to a first potential or to a second potential;
said first transistor being arranged to selectively connect said column conductor to said first potential and cooperating with read management means of at least one defined row in order to pass a read current through a cell belonging to said column and to said row; and
said second transistor being arranged to selectively connect said column conductor to said second potential, in cooperation with write management means of at least one defined row, which write management means are arranged in order to selectively pass
a write current to one state in one direction through a cell belonging to said column and to said row, and
a write current to the other state in the other direction through said cell.

5. The component according to claim 1, wherein the column selection means comprise, for each pair of columns complementary to each other,
for each of said two complementary columns, at least one first transistor realized or connected in integrated manner at one end of the conductor of this column, and which is arranged to selectively connect said column conductor to a defined potential in cooperation with read management means of at least one defined row (R1L) in order to pass a read current through a cell belonging to said column and to said row; and
at least one second transistor realized or connected in integrated manner at one end of the conductors of said two complementary columns, and which is arranged to selectively connect said column conductors to each other in cooperation with write management means of at least two defined rows in order to pass a write current, selectively in one direction or in the other direction, successively through at least one cell belonging to one of said columns and to one of said rows, then through said second transistor, then through at least one cell belonging to the other of said columns and to the other of said rows.

6. The component according to claim 1, further comprising means for reading the state of the cells by differential reading of at least one electrical value originating at least
from a first cell connected to a first column and to a first row, and
from a second cell connected to a second row different from said first row and to a second column different from the first column.

7. The component according to claim 6, further comprising at least one first column referred to as an even reference column the cells of which are connected to a first series of rows referred to as even rows arranged to read said even reference cells by differential reading with the cells of at least one first series of read columns referred to as even read columns,
and at least one second column referred to as a an odd reference column the cells of which are connected to a second series of rows referred to as odd rows arranged to read said odd reference cells by differential reading with the cells of at least one second series of read columns referred to as odd read columns.

8. The component according to claim 7, wherein the cells of one of the reference columns have an electrical resistance less than the resistance of the cells of the read columns, and the cells of the other of the reference columns have an electrical resistance greater than the resistance of the cells of the read columns.

9. The component according to claim 1, wherein the first row and the second row are contiguous and each comprise a plurality of cells connecting them, alternately, to the columns that they successively intersect.

10. The component according to claim 1, wherein the first column and the second column are contiguous and each comprise a plurality of cells connecting them, alternately, to the rows that they successively intersect.

11. The component according to claim 1, wherein the read means comprise a plurality of sense amplifiers which are realized or connected in integrated manner at a first end of the rows of the matrix,
and which are each connected to two rows of the matrix and arranged to carry out a differential reading from said two rows.

12. The component according to claim 1, further comprising write means arranged to supply a defined write current to change the state of a cell, wherein said write means comprise a plurality of write circuits which are realized or connected in integrated manner at a second end of the rows of the matrix, and which are each connected to at least one row of the matrix and arranged and controlled by input data to write at least one cell of said row.

13. The component according to claim 11, wherein the first end and the second end of the rows are the two opposite ends of the conductors of said rows.

14. The component according to claim 1, further comprising at least one first matrix of cells realized in integrated manner in a defined level which is integrated in superimposed manner with at least:
another level in which a second cell matrix is realized in integrated manner; or
another level in which a control circuit is realized in integrated manner arranged to include one of: the selection means, the read management means, the write management means, read data managing means, write data managing means, or a combination of these means.

15. An electronic device comprising at least one electronic memory component according to claim 1.

16. A method for electronic processing of at least one two-dimensional memory matrix including a plurality of unitary memory cells, each of the unitary memory cells including two terminals, the unitary memory cells are each realized at the intersection of a first conductor defining a column and a second conductor defining a row within said matrix, and are each connected to said first and second conductors, comprising the following steps:
selectively activating in binary manner one or more of the columns, each containing a plurality of the unitary memory cells to be processed by logic column selection means located outside of the matrix; and
realizing parallel write or read processing on said plurality of cells to be processed, by a plurality of write management means or read management means arranged to process at least one first row to which said plurality of cells to be processed belong.

17. The method according to claim 16, wherein the processing step comprises a parallel operation of reading a plurality of cells belonging to the one or more activated columns and to a first plurality of rows, which is realized by a plurality of sense amplifiers arranged to process said first plurality of rows by differential reading with a second plurality of rows.

18. The method according to claim 16, wherein the processing step comprises a parallel operation of writing a plurality of cells referred to as write cells belonging to the one or more activated columns, and which operation is realized by a plurality of write drivers connected to a plurality of rows to which said write cells belong.

19. The method according to claim 16, further comprising:
at least one phase of reading in parallel the bits of a memory word formed by a plurality of read cells belonging to the one or more activated columns and to a first plurality of rows, by read management means arranged in order to process said first plurality of rows by differential reading with a second plurality of rows; and
at least one phase of writing in series the bits of said memory word within said activated columns, by a plurality of write operations each relating to a number of cells strictly less than the number of said plurality of cells read.

20. The method according to claim 16, further comprising the following steps:
activating each of the one or more columns to be activated by connection of its column conductor to a first potential, by a transistor realized or connected in integrated manner at a first end of said column;
creating, in a defined direction, of a read current in at least one cell referred to as a read cell belonging both to one of said activated columns and to at least one first row, by at least one current source connected to said first row;
creating, in a defined direction, of a read current in at least one other cell referred to as a complementary cell corresponding to said read cell, and belonging both to one of the activated columns and to at least one second row different from said first row, by at least one current source connected to said second row; and
reading of each of said read cells, by differential measurement of the currents passing on the one hand into said read cell and on the other hand into said complementary cell, by at least one comparator circuit connected both to said first row and to said second row.

21. The method according to claim 16, further comprising:
changing to a first state at least one cell referred to as a write cell, belonging to the at least one activated column and to at least one defined row, said operation comprising the following steps:
connecting to a first potential, the conductor of the at least one activated column, by a first transistor realized or connected in integrated manner at a first end of said at least one activated column; and
creating, in said write cell, a write current in a first direction, by at least one current source connected to said row; or
changing to a second state at least one cell referred to as a write cell, belonging to the at least one activated column and to at least one defined row, said operation comprising the following steps:
connecting to a second potential different from the first potential, the conductor of the at least one activated column, by a second transistor different from the first transistor, realized or connected in integrated manner at a second end of said at least one activated column; and
creating, in said write cell, a write current in a second direction opposite the first direction, by at least one current source connected to said row; or
a combination of these two change operations.

22. The method according to claim 16, wherein the write step comprises an operation of changing at least one cell referred to as a write cell, belonging to the at least one activated column and to at least one defined row, said change operation comprising the following steps:

connecting to a defined potential (Vdd), the conductor of the at least one activated column (C1L), by a transistor (TW1L) realized or connected in integrated manner at a first end of said at least one activated column; and creating, in said write cell, a write current selectively in one direction or in the other, by at least one current source connected to said row, so as to change said cell to one or the other of its states.

23. The method according to claim 16, wherein the write step comprises an operation of changing at least two cells referred to as write cells, belonging on the one hand to at least two different activated columns and on the other hand to at least two different rows, said change operation comprising the following steps:

connecting to each other the conductors of the at least two activated columns, for example by a transistor realized or connected in integrated manner at one end of said columns; and creating, by at least one current source connected to at least one of said rows, a write current passing successively through at least one cell belonging to one of said columns and to one of said rows, then through said transistor, then through at least one cell belonging to the other of said columns and to the other of said rows, selectively in one direction or in the other, so as to simultaneously change the state of said cells.

24. The method according to claim 16, wherein the processing step comprises the following steps:

activating at least one first column referred to as a read column containing one or more cells referred to as read cells belonging to at least one row connected to one input of at least one sense amplifier;

activating a column referred to as a reference column common to several read columns, which reference column contains a reference cell for each of the read cells, each of said reference cells belonging to a row connected to another input of the same sense amplifier than the read cell which corresponds thereto; and reading each of the read cells by differential measurement between said read cell and the reference cell which corresponds thereto.

25. The method according to claim 16, wherein the processing step comprises the following steps:

activating a first column referred to as a left-hand column, containing one or more read cells referred to as left-hand cells which belong to one or more rows referred to as left-hand rows connected to one input of at least one sense amplifier;

activating a second column referred to as a right-hand column, containing a cell referred to as a right-hand cell for each left-hand read cell, each right-hand cell belonging to a row referred to as a right-hand row connected to the other input of the same sense amplifier as the left-hand cell which corresponds thereto; and reading each of the left-hand read cells by differential measurement between said left-hand cell and the right-hand cell which corresponds thereto.

26. The method according to claim 16, wherein the processing step comprises the following steps:

activating at least one column containing one or more read cells referred to as even cells, belonging to one or more rows referred to as even rows connected to one input of a sense amplifier, and one or more cells referred to as odd cells belonging to one or more rows referred to as odd rows each of which is connected to the other input of the same sense amplifier than the even row which corresponds thereto;

reading each of the even read cells by differential measurement between said even read cell and another cell referred to as an odd cell which corresponds thereto, belonging both to the same activated column and to the odd row corresponding to said even row.

27. An electronic memory component manufacturing system, comprising means arranged for realizing a component according to claim 1.

* * * * *